United States Patent
Nair et al.

(10) Patent No.: US 9,012,330 B2
(45) Date of Patent: Apr. 21, 2015

(54) METHOD FOR SEMICONDUCTOR CROSS PITCH DOUBLED PATTERNING PROCESS

(71) Applicant: Nanya Technology Corp., Tao-Yuan Hsien (TW)

(72) Inventors: Vinay Nair, Boise, ID (US); Lars Heineck, Garden City, ID (US)

(73) Assignee: Nanya Technology Corp., Gueishan Dist., Taoyuan (TW)

( * ) Notice: Subject to any disclaimer, the term of this patent is extended or adjusted under 35 U.S.C. 154(b) by 0 days.

(21) Appl. No.: 13/974,032

(22) Filed: Aug. 22, 2013

(65) Prior Publication Data

US 2015/0056810 A1 Feb. 26, 2015

(51) Int. Cl.
*H01L 21/308* (2006.01)

(52) U.S. Cl.
CPC .................. *H01L 21/3088* (2013.01)

(58) Field of Classification Search
CPC .............. H01L 21/768; H01L 21/0338; H01L 21/76816; H01L 21/31144; H01L 21/31116
USPC .......... 257/773, E21.577; 438/675, 700, 703, 438/717

See application file for complete search history.

(56) References Cited

U.S. PATENT DOCUMENTS

| 2009/0311635 | A1* | 12/2009 | Chen et al. | 430/323 |
| 2010/0248491 | A1* | 9/2010 | Sun et al. | 438/717 |
| 2012/0049377 | A1* | 3/2012 | Yang et al. | 257/773 |

* cited by examiner

*Primary Examiner* — Fernando L Toledo
*Assistant Examiner* — Adam S Bowen
(74) *Attorney, Agent, or Firm* — Winston Hsu; Scott Margo

(57) ABSTRACT

The present invention provides a method of cross double pitch patterning for forming a contact printing mask. First, a first, a second and a third layer a successively deposited; a photoresist is deposited on the third layer, and then trimmed into a first pre-pattern, on which an oxide layer is deposited. The oxide layer is etched into spacers forming a first pattern that is then etched into the third layer. A second cross pattern is formed the same way on the third layer. Finally the first and second layers are etched with selectivity both patterns.

8 Claims, 6 Drawing Sheets

METHOD FOR SEMICONDUCTOR CROSS PITCH DOUBLED PATTERNING PROCESS

BACKGROUND OF THE INVENTION

1. Field of the Invention

The present invention generally relates to a semiconductor process, and more precisely to a method for a cross pitch doubled patterning process that does not require multiple films stacks or any planarization step.

2. Description of the Prior Art

In semiconductor manufacturing processes, in order to transfer an integrated circuit layout onto a semiconductor wafer, the integrated circuit layout is first designed and formed as a mask pattern. The mask pattern is then transferred to another layer. However, with the increasing miniaturization and the higher integration requirements of semiconductor devices, like memory devices (for example DRAM), the dimensions become finer and the dimensions of the masks need to become smaller as well.

Smaller holes sizes for contact printing masks are therefore obtained through double patterning with the use of multiple crossed patterns. Nevertheless, in order to obtain the desired final patterns, multiple stacks layers are used, thereby increasing the heights of the wholes structures leading to high aspect ratios. High aspect ratios are here a source of many variations that are to be avoided in order to achieve the most precise structures for obtain better performances in semiconductor devices.

In order to obtain the desired patterns, the actual processes using multiple layers also need more fabricating steps, and more steps in between, like planarization steps that are needed to achieve leveled semiconductor structures. All these steps make the whole process complex, long and expensive.

Therefore, how to reduce the number of layers needed in the process, so as to reduce the aspect ratio, as well as how to reduce the complexity of the process, so as to reduce the fabricating costs and time are important goals in this field.

SUMMARY OF THE INVENTION

The present invention proposes a method for a cross pitch doubled patterning process that does not require multiple films stacks or any planarization step, so as to avoid high aspect ratio which can cause variations in the prior art processes.

Accordingly, the method of the present invention comprises the following steps: a first layer, second layer and a third layer are stacked from bottom to top, wherein the first layer is a carbon layer, the second layer is a dielectric anti reflective coating (DARC) film, the third layer is an antireflective layer, and the second and third layer have a very good etching selectivity from one another.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the presented invention, preferred embodiments will be described in detail. The preferred embodiments of the present invention are illustrated in the accompanying drawings with numbered elements.

Figure 1:
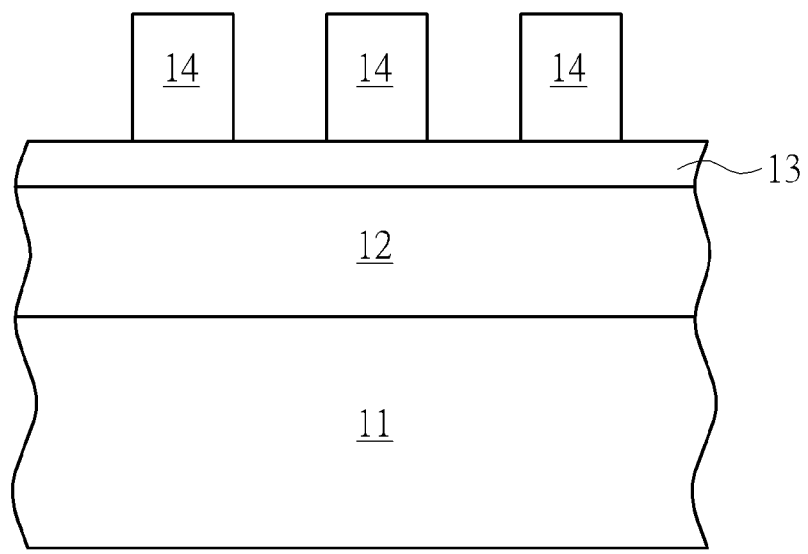
FIGS. 1-4 illustrate cross-sectional views of the first steps of forming a contact printing mask according to the method of the present invention.

According to FIG. 1, a first layer 11, a second layer 12 and a third layer 13 are successively stacked form bottom to top. The first layer 11 material may comprise carbon, and will serve ultimately as a contact pattern transfer hard mask after all the steps of the present invention are performed. The second layer 12 is dielectric anti-reflective coating film (DARC layer); it is deposited conformally on the first carbon layer 11 and substantially has a thickness comprised in a range of 200 to 260 Angstroms. The third layer 13 material comprises anti reflective materials; it is deposited conformally on the DARC layer 12, and substantially has a thickness of about 50 Angstroms.

The DARC material of the second layer 12 and the anti reflective materials of the third layer 13 are chosen to have different etching rates, so that the two layers can be very selectively etched one at a time.

A Photoresist layer 14 is formed on the third layer 13. The photoresist layer 14 is trimmed according to a first pattern, so that later formed spacers can form a first double pitch pattern, as shown on FIG. 1.

Figure 2:
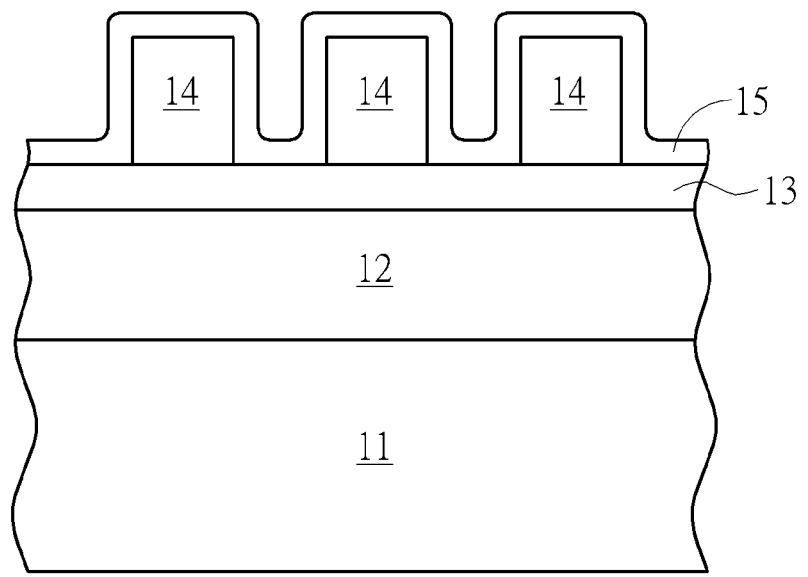

Please refer now to FIG. 2. FIG. 2 represents the next step of the method of the present invention: an oxide layer 15 is deposited through an Atomic Layer Deposition process, so as to form a uniform layer on the pre-patterned photoresist 14 and the third layer 13.

Figure 3:
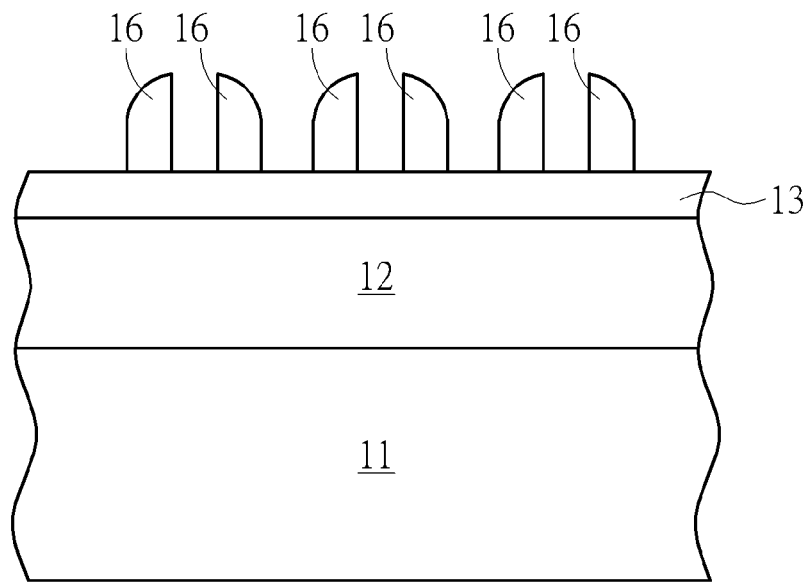

The oxide layer 15 is etched so as to form spacers 16 on each side of the pre-patterned photoresist 14. Then, the photoresist 14 is fully stripped, thereby achieving a first double pitch pattern P1, as shown in FIG. 3.

Figure 4:
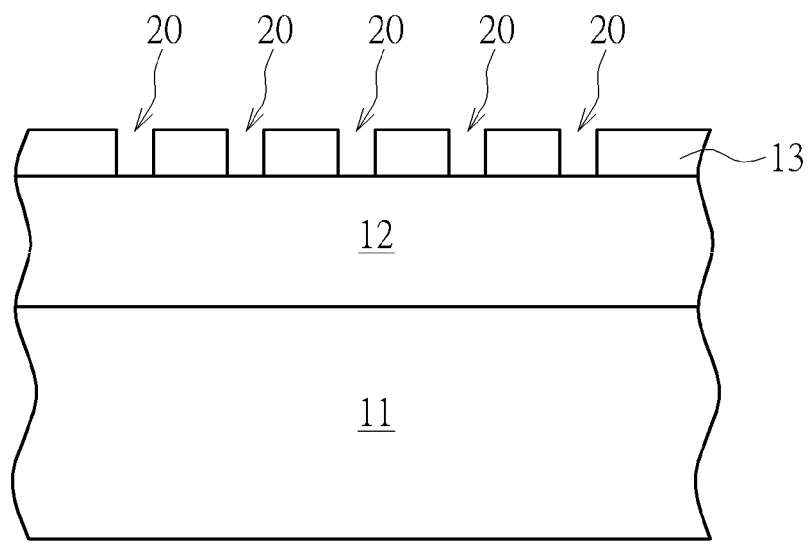
Figure 5:
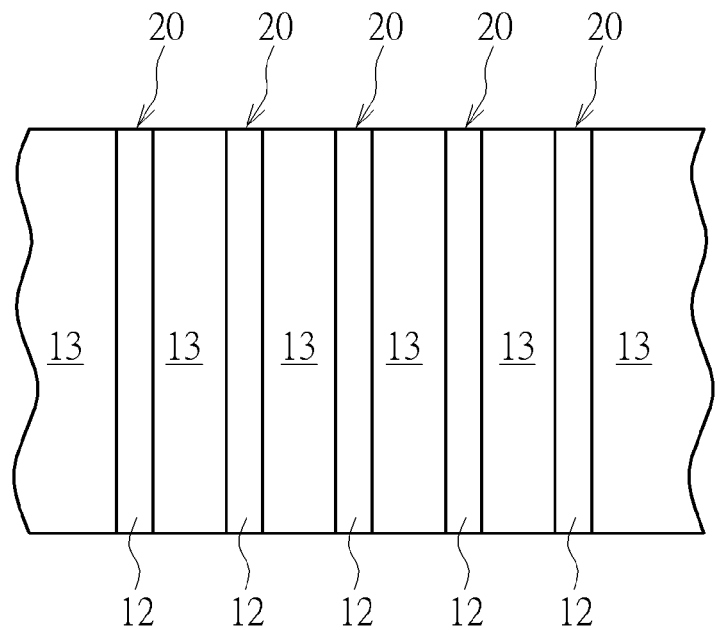
FIG. 5 illustrates a top view of a first pattern deposited on a structure to form a contact printing mask according to the method of the present invention.

In the next step, the first double pattern P1 is used as a mask for etching the underlying third layer 13, and the second layer 12 is used as an etch stop layer. Trenches 20 corresponding to the first pattern P1 are therefore formed into the third layer 13 as shown in the cross-sectional view of FIG. 4 or the top view of FIG. 5.

Figure 6:
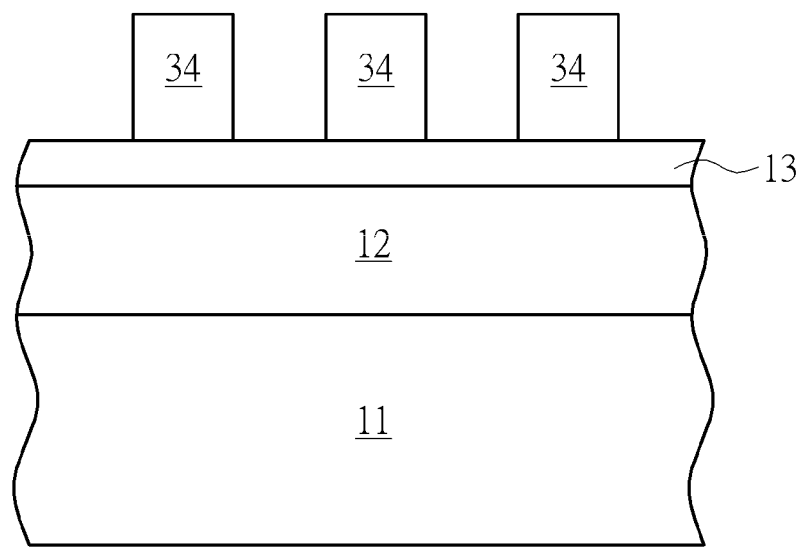
FIG. 6-8 illustrate cross-sectional views of the following steps of forming a contact printing mask according to the method of the present invention.

Similarly, a second cross pattern P2 will be formed in the next steps. First, as shown in FIG. 6, a photoresist layer 34 is formed on the third layer 13. The photoresist layer 34 is trimmed according to a second pattern, so that later formed spacers can form a second double pitch pattern, wherein the second pattern is a cross pattern, i.e. the lines defined by the second pattern cross the lines of the first pattern with an specific angle, which preferably is a right angle, but not limited thereto.

Figure 7:
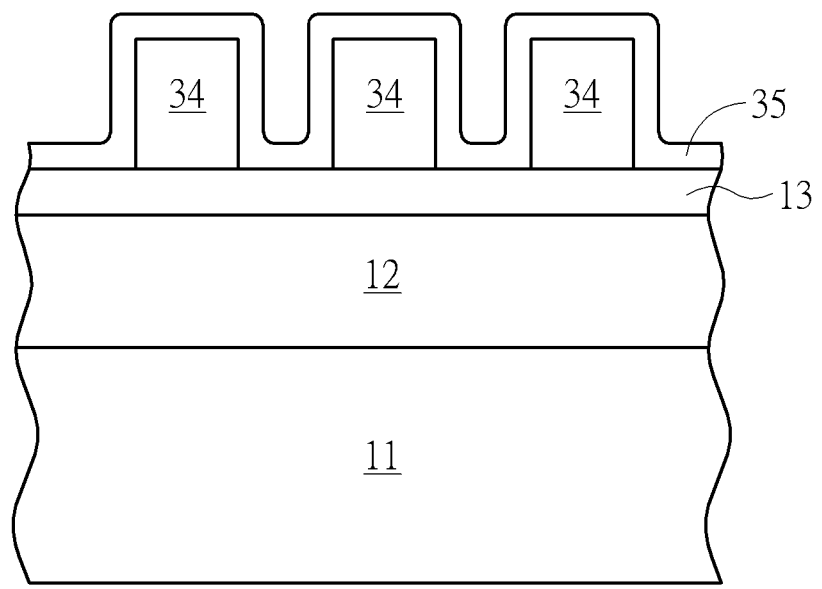

Then, as shown in FIG. 7, an oxide layer 35 is deposited through an Atomic Layer Deposition process (ALD), so as to form a uniform layer on the patterned photoresist 34 and the third layer 13.

Figure 8:
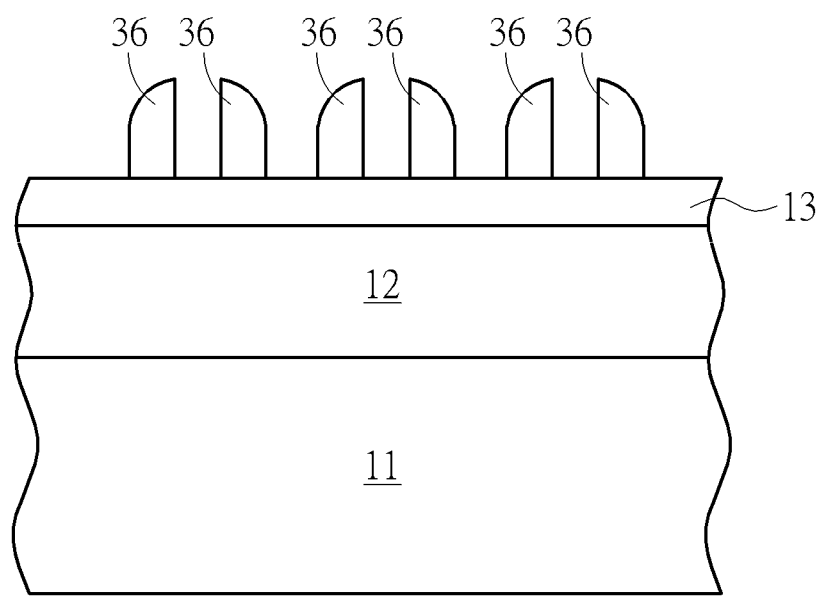

The oxide layer 35 is etched so as to form spacers 36 on each side of the pre-patterned photoresist 14. Then, the photoresist 34 is fully stripped, thereby achieving a second double pitch pattern P2, as shown in FIG. 8.

Figure 9:
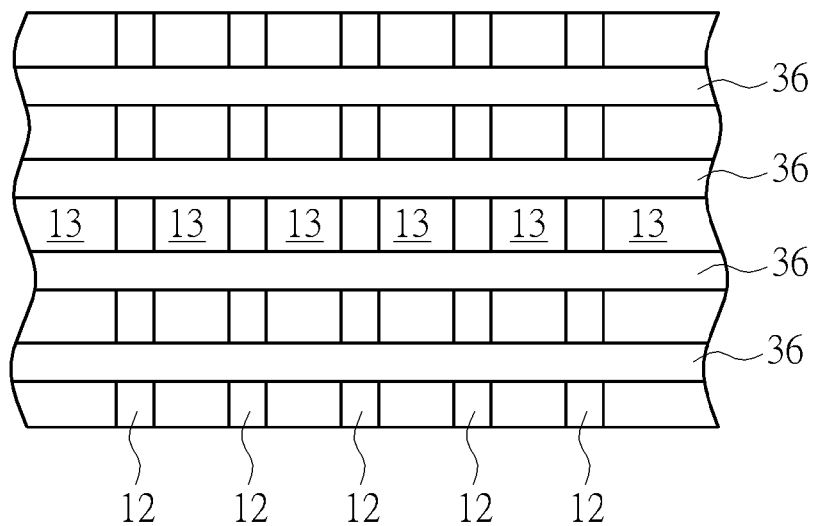
FIG. 9 illustrates a top view of a second pattern deposited on a structure to form a contact printing mask according to the method of the present invention.

The first double pattern P1 and the second double pattern P2 form a final pattern, which is a cross pitch double pattern P3. The final pattern P3 is shown in FIG. 9, wherein the patterned third layer 13 and the oxide spacers 36 will serve as a mask to form contact holes.

Figure 10:
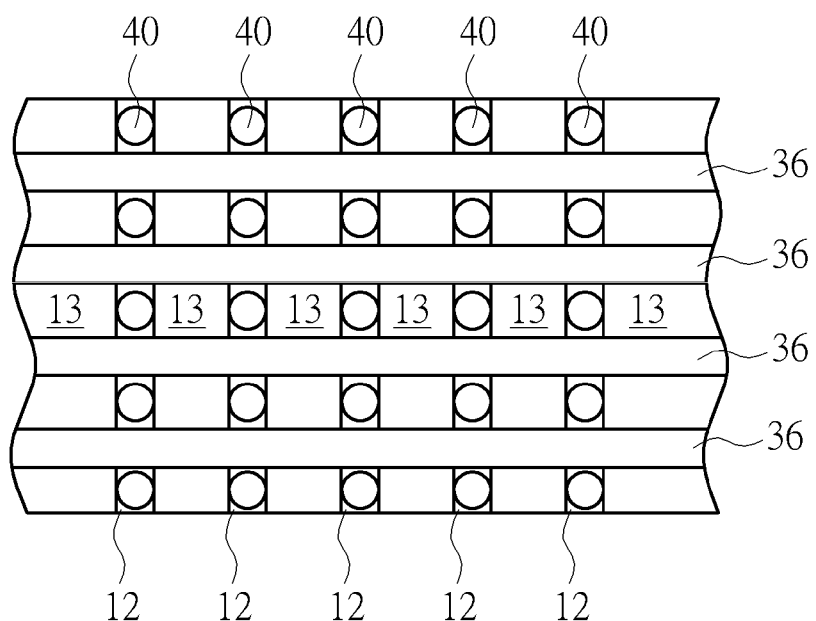
FIG. 10 illustrates a top view of a final pattern etched in a structure to form a contact printing mask according to the method of the present invention.

In the next step, the oxide spacers 36 of second double pattern P2 and the third layer 13 patterned according to the first double pattern P1 are used as a mask for etching the underlying second layer 12 and the first layer 11. Since the third layer 13 and the second layer 12 have different etching rates providing them very good etching selectivity, only the parts not covered by the oxide spacers 36 or the patterned third layer 13 will be etching during the process, thereby forming a pattern of contact holes 40, as shown in FIG. 10.

Figure 11:
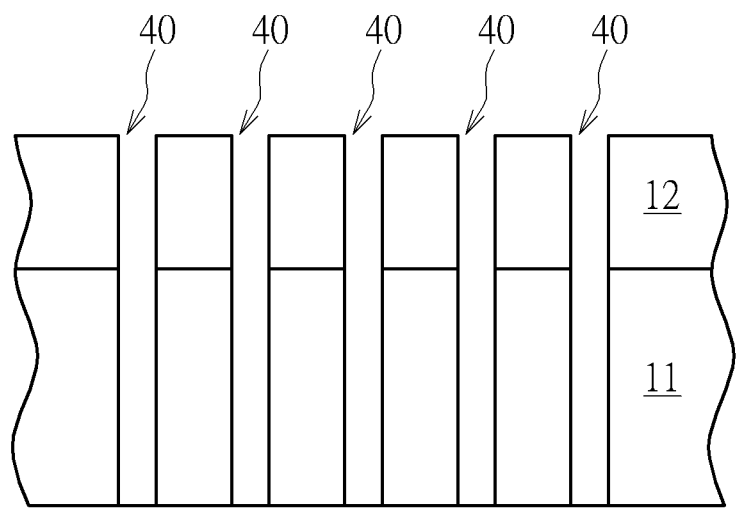
FIG. 11 illustrates a cross-sectional view of a final pattern etched on a structure to form a contact printing mask according to the method of the present invention.
Figure 12:
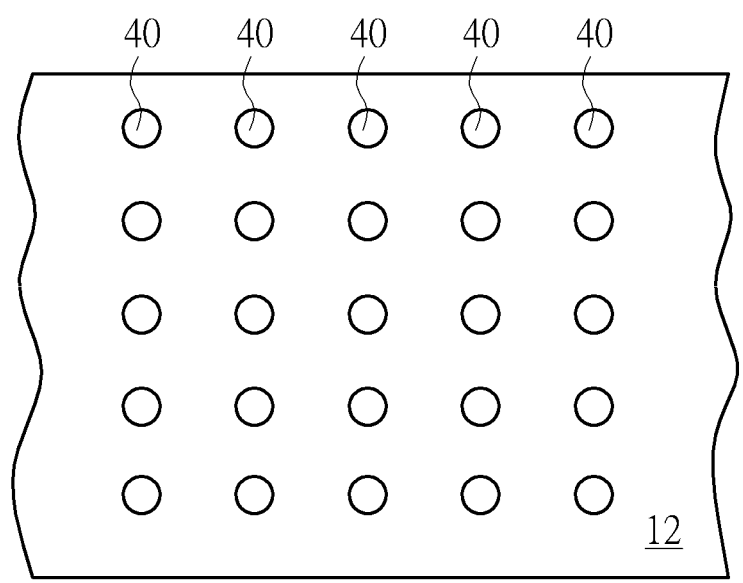
FIG. 12 illustrates a top view of a final pattern etched on a structure to form a contact printing mask according to the method of the present invention.

After the contact holes have been etched into the second layer 12 and the first layer 11, the oxide spacers 36 and the third layer 13 are then etched away, so as to obtain a final form of the desired contact printing mask, as shown in the cross sectional view in FIG. 11 and the top view in FIG. 12.

To summarize, the present invention provides a novel method for forming a cross pitch double pattern contact printing mask for semiconductor processes that forms successively two double pitch and crossed masks so as to achieve very fine contact holes with no specific needs of planarization steps or multi layers stacking, thereby ensuring a low aspect ration for better performances and limiting the processing time and costs.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for performing a double patterning process of a semiconductor structure, comprising the following steps:
   depositing a first, a second and a third layer on a substrate sequentially from bottom to top, wherein the second and the third layer have very selective etching rates from one another;
   depositing a first photoresist layer on the third layer,
   trimming the resist into a first pre-pattern;
   depositing a first oxide layer;
   etching the deposited first oxide layer into spacers on each side of the resist;
   stripping the resist fully, thereby obtaining a first patterned mask made of the remaining spacers;
   etching said first pattern into the third layer with selectivity to the second layer below to thereby forming a patterned third layer, wherein the second layer act as an etch stop layer;
   after etching said first pattern into the third layer, depositing a second photoresist layer on the patterned third layer;
   trimming the resist into a cross pre-pattern;
   depositing a second oxide layer;
   etching the deposited second oxide layer into spacers on each side of the patterned resist;
   stripping the second photoresist layer fully, thereby obtaining a second patterned mask made of the remaining spacers;
   performing an etching process with selectivity to the spacers and to the patterned third layer to etch the second layer and first layer, thereby achieving a final cross pattern of contact holes in the second layer and the first layer; and
   after forming the final cross pattern of contact holes in the second layer and the first layer, etching away the remaining oxide spacers and the patterned third layer, thereby obtaining a final contact printing mask.

2. A method for performing a double patterning process of a semiconductor structure according to claim 1, wherein the first layer material comprises carbon.

3. A method for performing a double patterning process of a semiconductor structure according to claim 1, wherein the second layer is a Dielectric Anti Reflective Coating (DARC).

4. A method for performing a double patterning process of a semiconductor structure according to claim 1, wherein the second layer has a thickness comprised in a range of 200 to 260 Angstroms.

5. A method for performing a double patterning process of a semiconductor structure according to claim 1, wherein the third layer material comprises anti reflective material.

6. A method for performing a double patterning process of a semiconductor structure according to claim 1, wherein the third layer material has a thickness of about 50 Angstroms.

7. A method for performing a double patterning process of a semiconductor structure according to claim 1, wherein the first oxide layer for forming the spacers is deposited through an Atomic Layer Deposition process (ALD).

8. A method for performing a double patterning process of a semiconductor structure according to claim 1, wherein the second oxide layer for forming the spacers is deposited through an Atomic Layer Deposition process (ALD).

* * * * *